United States Patent
Frougier et al.

(10) Patent No.: US 10,608,082 B2
(45) Date of Patent: Mar. 31, 2020

(54) FIELD-EFFECT TRANSISTORS INCLUDING MULTIPLE GATE LENGTHS

(71) Applicant: GLOBALFOUNDRIES Inc., Grand Cayman (KY)

(72) Inventors: Julien Frougier, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/994,402

(22) Filed: May 31, 2018

(65) Prior Publication Data

US 2019/0371887 A1 Dec. 5, 2019

(51) Int. Cl.
| | |
|---|---|
| *H01L 29/06* | (2006.01) |
| *H01L 29/423* | (2006.01) |
| *H01L 21/8234* | (2006.01) |
| *H01L 29/10* | (2006.01) |
| *H01L 29/08* | (2006.01) |

(52) U.S. Cl.
CPC .. *H01L 29/0669* (2013.01); *H01L 21/823456* (2013.01); *H01L 29/0847* (2013.01); *H01L 29/1033* (2013.01); *H01L 29/42376* (2013.01)

(58) Field of Classification Search
CPC .............. H01L 29/0669; H01L 29/0673; H01L 29/66545; H01L 29/42392; H01L 29/785
See application file for complete search history.

(56) References Cited

U.S. PATENT DOCUMENTS

| | | | | |
|---|---|---|---|---|
| 8,946,789 | B2* | 2/2015 | Kim | B82Y 10/00 |
| | | | | 257/288 |
| 10,115,788 | B2* | 10/2018 | Ching | H01L 21/823431 |
| 2006/0240622 | A1* | 10/2006 | Lee | H01L 29/42392 |
| | | | | 438/257 |
| 2014/0225065 | A1* | 8/2014 | Rachmady | H01L 29/42392 |
| | | | | 257/24 |
| 2017/0062598 | A1* | 3/2017 | Seo | B82Y 10/00 |
| 2017/0256608 | A1* | 9/2017 | Suk | H01L 29/0653 |
| 2018/0006139 | A1* | 1/2018 | Seo | H01L 29/66795 |

* cited by examiner

*Primary Examiner* — Zandra V Smith
*Assistant Examiner* — John M Parker
(74) *Attorney, Agent, or Firm* — Thompson Hine LLP; Francois Pagette (57) ABSTRACT

Structures for a field-effect transistor and methods of forming structures for a field-effect transistor. A semiconductor fin having a channel region, a nanowire arranged over the channel region of the semiconductor fin, a source/drain region connected with the channel region of the semiconductor fin and the nanowire, and a gate structure that overlaps with the channel region of the semiconductor fin and the nanowire. The nanowire has a first gate length, and the channel region of the semiconductor fin has a second gate length that is greater than the first gate length.

19 Claims, 12 Drawing Sheets

FIELD-EFFECT TRANSISTORS INCLUDING MULTIPLE GATE LENGTHS

BACKGROUND

The present invention relates to semiconductor device fabrication and integrated circuits and, more specifically, to structures for a field-effect transistor and methods of forming a structure for a field-effect transistor.

Device structures for a field-effect transistor generally include a source, a drain, and a gate electrode configured to switch carrier flow in a channel formed in a semiconductor body arranged between the source and drain. The semiconductor body and channel of a planar field-effect transistor are arranged beneath the top surface of a substrate on which the gate electrode is supported. When a control voltage exceeding a designated threshold voltage is applied to the gate electrode, the flow of carriers in the channel produces a device output current.

A fin-type field-effect transistor is a type of non-planar device structure that may be more densely packed in an integrated circuit than planar field-effect transistors. A fin-type field-effect transistor may include a fin, a source and a drain, and a gate electrode that wraps around a channel region located in the fin between the source and the drain. The wrapped arrangement between the gate structure and fin may improve control over the channel and reduce the leakage current when the fin-type field-effect transistor is in its 'Off' state in comparison with a planar transistor. This, in turn, may enable the use of lower threshold voltages than in planar transistors, and may result in improved performance and lowered power consumption.

Nanosheet field-effect transistors have been developed as a type of non-planar field-effect transistor that may permit additional increases in packing density in an integrated circuit. The body of a nanosheet field-effect transistor includes multiple nanosheet channel layers that are arranged in a layer stack. The nanosheet channel layers are initially arranged in a layer stack with sacrificial layers containing a material (e.g., silicon-germanium) that can be etched selectively to the material (e.g., silicon) constituting the nanosheet channel layers. The sacrificial layers are etched and removed in order to release the nanosheet channel layers and to provide spaces for the formation of a gate stack. Sections of the gate stack may surround all sides of the individual nanosheet channel layers in a gate-all-around arrangement. Similarly, nanowires may be substituted for nanosheets to form nanowire field-effect transistors.

Improved structures for a field-effect transistor and methods of forming a structure for a field-effect transistor are needed.

SUMMARY

In embodiments of the invention, a structure is provided for a field-effect transistor. The structure includes a semiconductor fin having a channel region, a nanowire arranged over the channel region of the semiconductor fin, a source/drain region connected with the channel region of the semiconductor fin and the nanowire, and a gate structure that overlaps with the channel region of the semiconductor fin and the nanowire. The nanowire has a first gate length, and the channel region of the semiconductor fin has a second gate length that is greater than the first gate length.

In embodiments of the invention, a method is provided for forming a field-effect transistor. The method includes forming a semiconductor fin and a nanowire arranged over a channel region of the semiconductor fin, epitaxially growing a source/drain region that is connected with the channel region of the semiconductor fin and the nanowire, and forming a gate structure that overlaps with the channel region of the semiconductor fin and the nanowire. The nanowire has a first gate length, and the channel region of the semiconductor fin has a second gate length that is greater than the first gate length.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
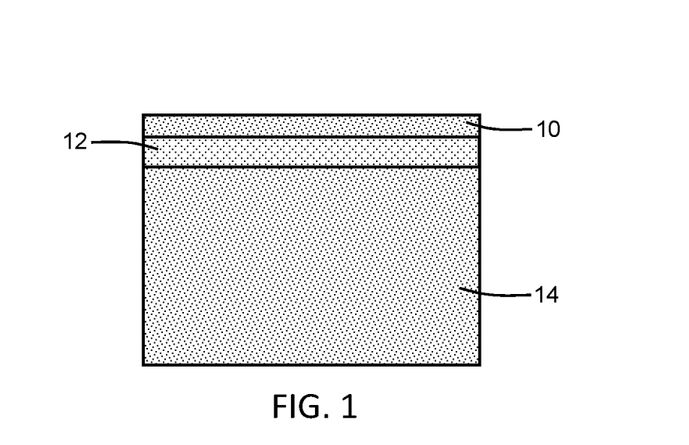
FIG. 1 is a cross-sectional view of a device structure at an initial fabrication stage of the processing method in accordance with embodiments of the invention.

With reference to FIG. 1 and in accordance with embodiments of the invention, a semiconductor layer 10 and a semiconductor layer 12 are arranged in a patterned layer stack on a substrate 14. The semiconductor layers 10, 12 may be formed on the substrate 14 by an epitaxial growth process during which the composition is alternated as the semiconductor layers 10, 12 are formed and the substrate 14 provides a crystal structure template for epitaxy. The substrate 14 may be composed of a semiconductor material, such as single-crystal silicon.

The semiconductor layer 10 is composed of a semiconductor material, and the semiconductor layer 12 is composed of a semiconductor material with a composition that is selected to be removed selective to the semiconductor materials of the semiconductor layer 10 and the substrate 14. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The respective compositions of the semiconductor layers 10, 12 are chosen through growth conditions during epitaxial growth. In an embodiment, the semiconductor material constituting the semiconductor layer 10 may be single-crystal silicon (Si), and the semiconductor material constituting the semiconductor layer 12 may be single-crystal silicon-germanium (SiGe) that can be etched at a higher rate than single-crystal silicon due to its germanium content. In an embodiment, the germanium content of the semiconductor layer 12 may range from twenty percent (20%) to thirty-five percent (35%).

Figure 2:
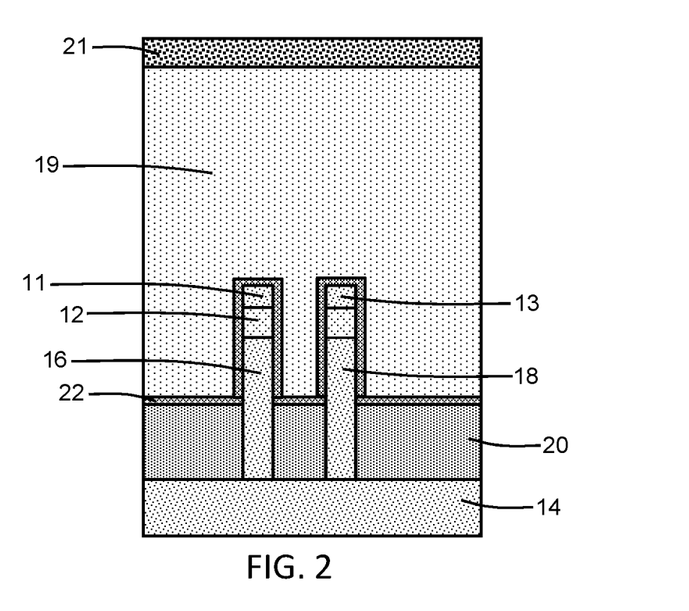
FIG. 2 is a cross-sectional view of the device structure at a fabrication stage subsequent to FIG. 1.
Figure 3:
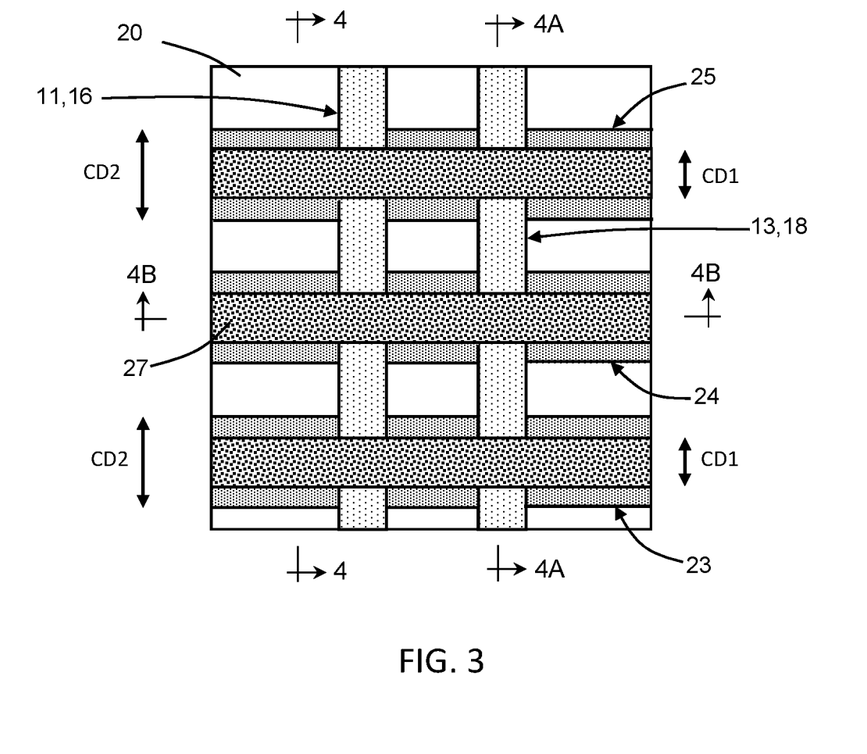
FIG. 3 is a top view of the device structure at a fabrication stage subsequent to FIG. 2.

With reference to FIG. 2 in which like reference numerals refer to like features in FIG. 1 and at a subsequent fabrication stage of the processing method, the semiconductor layer 10, the semiconductor layer 12, and a portion of the substrate 14 may be patterned using, for example, self-aligned double patterning (SADP), self-aligned quadruple patterning (SAQP), or direct-print single-exposure EUV patterning. The patterning of the portion of the substrate 14 forms fins 16, 18 that project from the recessed top surface of the non-patterned portion of the substrate 14 and that have a given height relative to the non-patterned portion of the substrate 14.

The patterning of the semiconductor layer 10 forms a nanowire 11 that is arranged over the fin 16, and a nanowire 13 that is arranged over the fin 18. The nanowire 11 may be aligned with the fin 16, and the nanowire 13 may be aligned with the fin 18. A portion of the patterned semiconductor layer 12 is arranged in a vertical direction between the nanowire 11 and the fin 16, and another portion of the semiconductor layer 12 is arranged in a vertical direction between the nanowire 13 and the fin 18.

The height or thickness of the nanowires 11, 13, which is established by the thickness of the semiconductor layer 10, is less than the height of the fins 16, 18. The nanowires 11, 13 may have a thickness that is equal to the thickness of the semiconductor layer 10 and a width that is established when the semiconductor layer 10 is patterned. The width of the nanowire 11 may be equal to its thickness and, similarly, the width of the nanowire 13 may be equal to its thickness. The nanowire 11 may have the same width as the fin 16, and the nanowire 13 may have the same width as the fin 18.

The utilization of nanowires, instead of nanosheets having a different aspect ratio due to a larger width, may have certain benefits. For example, a nanowire may outperform a nanosheet in electrostatics with lower drain-induced barrier lowering (DIBL) and a lower subthreshold swing (SSsat). For equivalent electrostatics, a nanowire may have a shorter gate length than a nanosheet.

Shallow trench isolation regions 20 may be formed that surround a lower portion of each of the fins 16, 18. The shallow trench isolation regions 20 may be composed of a dielectric material, such as an oxide of silicon (e.g., silicon dioxide ($SiO_2$)), that is deposited by chemical vapor deposition (CVD) and recessed with an etch-back process.

A thin dielectric layer 22 is formed on the nanowires 11, 13 and fins 16, 18, and may be composed of, for example, silicon dioxide ($SiO_2$). A blanket layer 19 is formed over the nanowires 11, 13 and fins 16, 18 and directly on the thin dielectric layer 22. The blanket layer 19 may be composed of a sacrificial dummy gate material, such as amorphous silicon (α-Si), that is deposited by, for example, chemical vapor deposition (CVD) and planarized using, for example, chemical mechanical polishing (CMP). A hardmask layer 21 is formed on the blanket layer 19. The hardmask layer 21 may be composed of a dielectric material, such as silicon nitride ($Si_3N_4$), silicon dioxide ($SiO_2$), etc., that is deposited by, for example, chemical vapor deposition (CVD).

With reference to FIGS. 3, 4, 4A, 4B in which like reference numerals refer to like features in FIG. 2 and at a subsequent fabrication stage of the processing method, multiple sacrificial gate structures 23, 24, 25 are formed from the blanket layer 19. The sacrificial gate structures 23, 24, 25 overlap with and wrap around the nanowires 11, 13 and fins 16, 18. Sections of the sacrificial gate structures 23, 24, 25 are also arranged along their respective lengths on the shallow trench isolation regions 20. The sacrificial gate structures 23, 24, 25 have a spaced-apart arrangement along the length of the nanowires 11, 13 and fins 16, 18, and the sacrificial gate structures 23, 24, 25 may be aligned transverse to the nanowires 11, 13 and fins 16, 18.

The sacrificial gate structures 23, 24, 25 may be formed by patterning the hardmask layer 21 with an etching process, such as reactive ion etching (ME), to form hardmask caps 27 arranged on the blanket layer 19. The pattern is then transferred from the hardmask caps 27 to the blanket layer using an etching process, such as reactive ion etching (ME). Following the etching process, the hardmask caps 27 are arranged over the sacrificial gate structures 23, 24, 25. The etching process forming the sacrificial gate structures 23, 24, 25 is selective to the dielectric material constituting the dielectric layer 22 that encapsulates the nanowires 11, 13, the fins 16, 18, and the semiconductor layer 12.

Each of the sacrificial gate structures 23, 24, 25 includes multiple width dimensions arranged along its height. Specifically, over the shallow trench isolation regions 20 and adjacent to the respective sidewalls of the fins 16, 18, each of the sacrificial gate structures 23, 24, 25 includes an upper section 28 with a critical dimension or width dimension CD1, a lower section 30 with a critical dimension or width dimension CD2, and an intermediate section 29 of varying width arranged in a vertical direction between the upper section 28 and the lower section 30. The width dimension CD2 of the lower section 30 is greater than the width dimension CD1 of the upper section 28. The intermediate sections 29 taper in the vertical direction from the width dimension CD2 to the width dimension CD1. The intermediate section 29 of the sacrificial gate structures 23, 24, 25 is arranged to be at the same height in the vertical direction as the portion of to semiconductor layer 12 over each of the respective fins 16, 18. Over the respective top surfaces of the fins 16, 18 and the semiconductor layers 12, 13, each of the sacrificial gate structures 23, 24, 25 only includes the upper section 28 of the narrower width dimension CD1.

The multiple widths of the sacrificial gate structures 23, 24, 25 are provided by modulating the etching process to change the lateral component of the etch rate as a function of time. The modulation may be generating by adjusting the bias applied on the chuck holding the substrate 14 during the etching process, the chemistry of the etching process, and/or polymerization during the etching process. The portion of the etching process with the higher lateral etch rate component forms the upper sections 28 and the portion of the etching process with the lower lateral etch rate component forms the lower sections 30. The tapering of the intermediate section 29 of each of the sacrificial gate structures 23, 24, 25 reflects the transition between the portion of the etching process with the higher lateral etch rate and the portion of the etching process with the lower lateral etch rate component.

Figure 4:
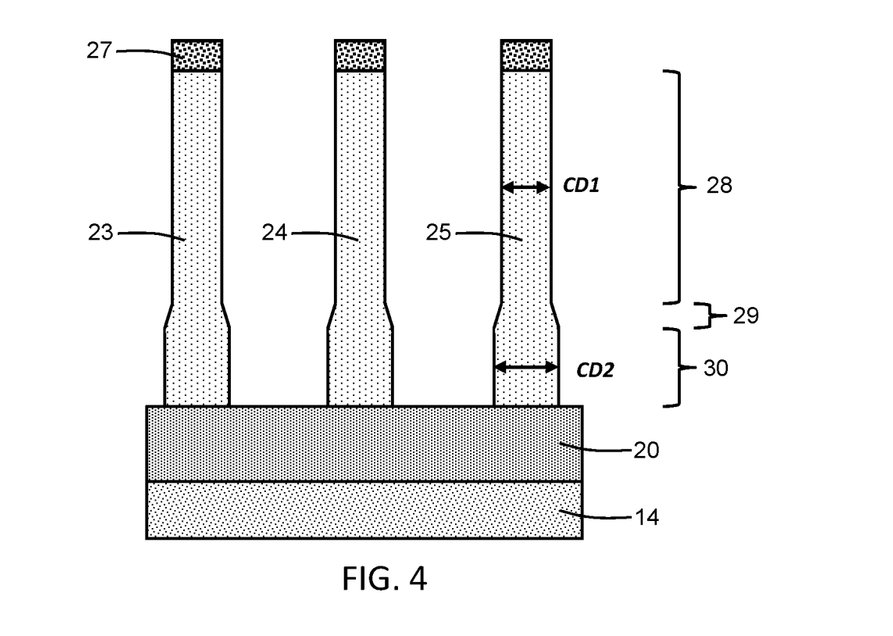
FIG. 4 is a cross-sectional view taken generally along line 4-4 in FIG. 3.
Figure 4A:
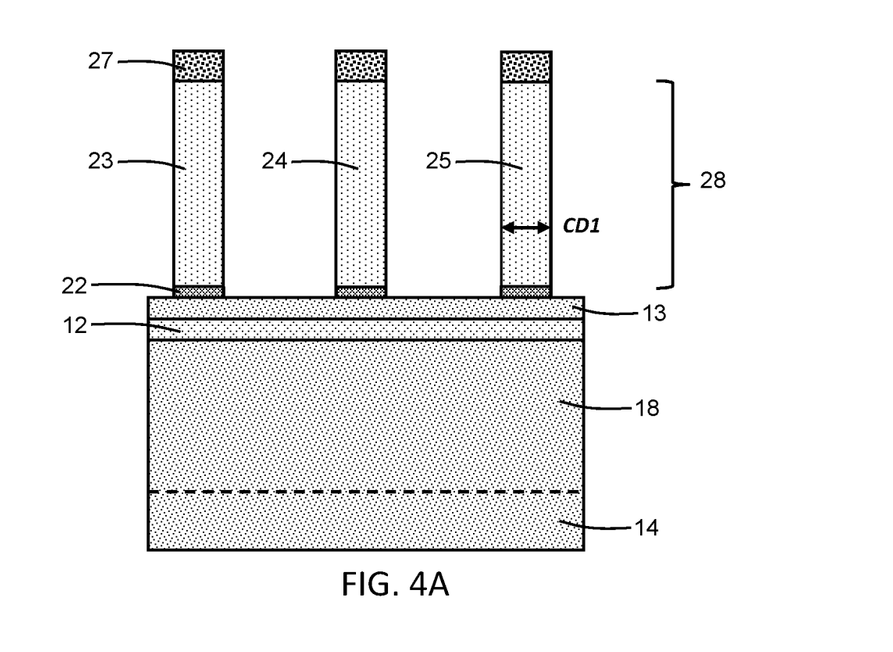
FIG. 4A is a cross-sectional view taken generally along line 4A-4A in FIG. 3.
Figure 4B:
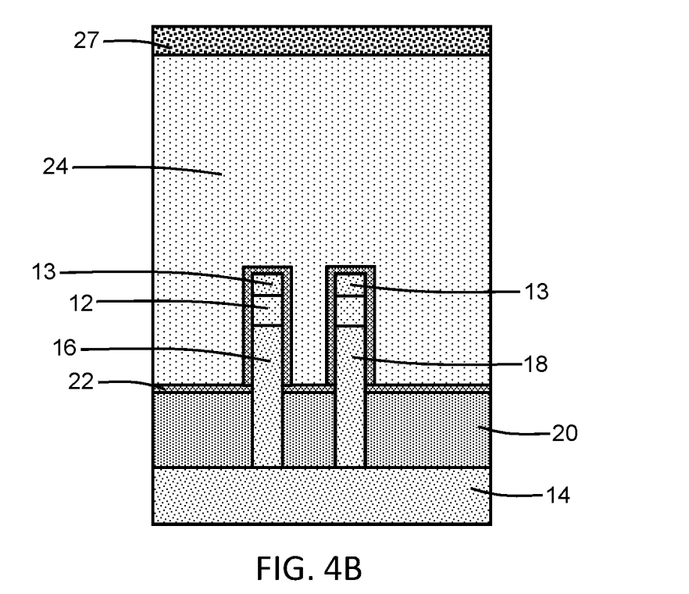
FIG. 4B is a cross-sectional view taken generally along line 4B-4B in FIG. 3.
Figure 5:
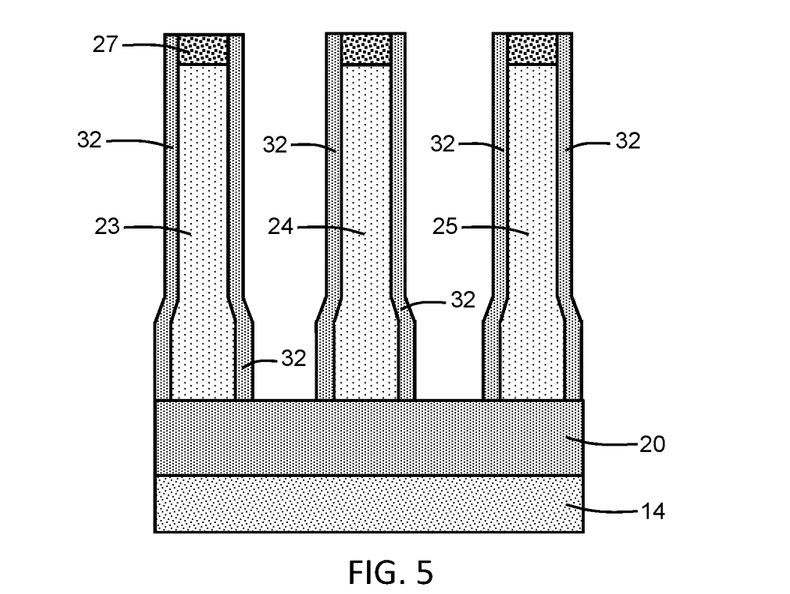
FIGS. 5-12 and 5A-12A are cross-sectional views of the device structure at successive fabrication stages of the processing method respectively subsequent to FIGS. 4 and 4A.
Figure 5A:
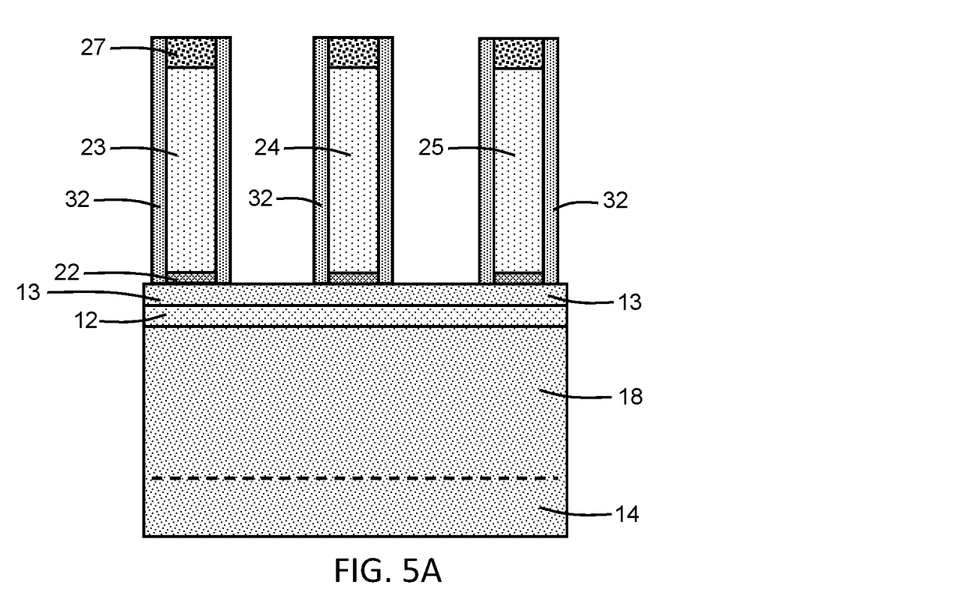

With reference to FIGS. 5, 5A in which like reference numerals refer to like features in FIGS. 4, 4A and at a subsequent fabrication stage of the processing method, sidewall spacers 32 are formed on the sidewalls of the sacrificial gate structures 23, 24, 25. The sidewall spacers 32 may be formed by depositing a conformal layer of a low-k dielectric material, such as SiBCN, and etching the conformal layer with a directional etching process, such as reactive ion etching (ME). The conformal layer and the sidewall spacers 32 formed from the conformal layer follow the tapered contour of the sidewalls provided by the multiple-width sections 28, 29, 30 of the sacrificial gate structures 23, 24, 25.

Figure 6:
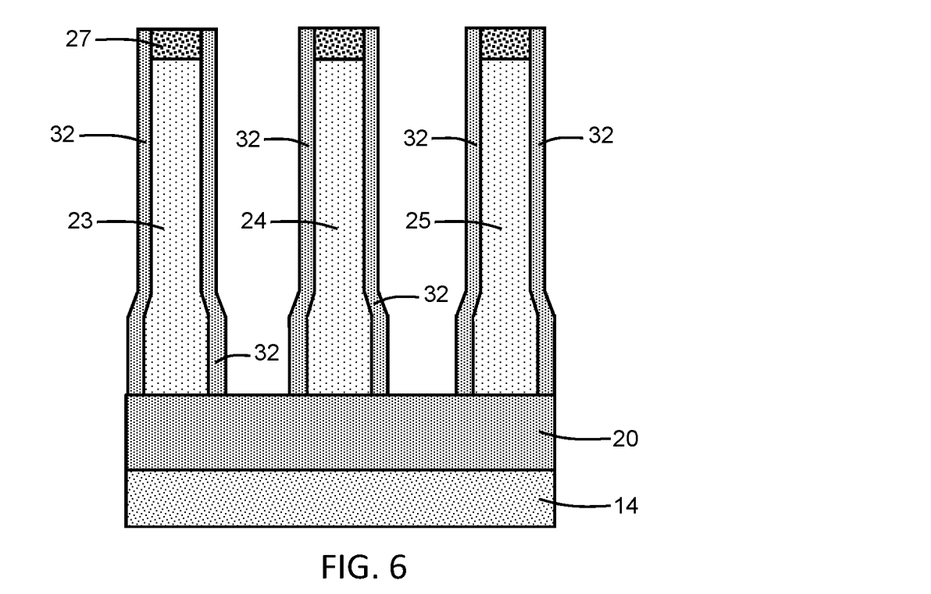
Figure 6A:
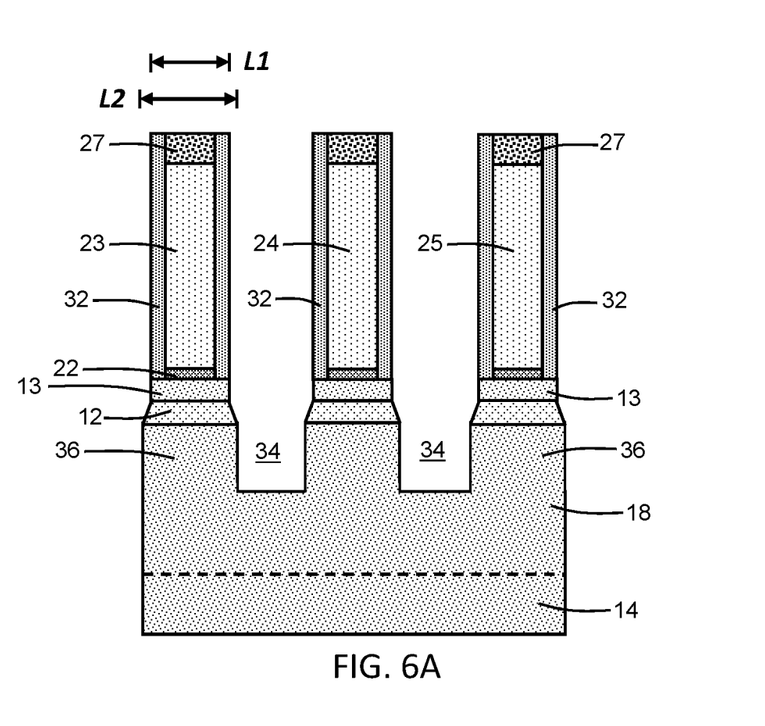

With reference to FIGS. 6, 6A in which like reference numerals refer to like features in FIGS. 5, 5A and at a subsequent fabrication stage of the processing method, trenches 34 are formed that extend through the nanowires 11, 13, the semiconductor layer 12, and the fins 16, 18 by a self-aligned etching process in which the respective sacrificial gate structures 23, 24, 25 operate as an etch mask. The self-aligned etching process, which may be a reactive ion etching (ME) process, may utilize one or more etch chemistries to etch the different semiconductor materials. The trenches 34 include sections of different width dimensions that arranged over the trench depth and that are provided by modulating the etching process, which may be a reactive ion etching (ME) process. The modulation may be generating by adjusting the bias applied on the chuck holding the substrate 14 during the etching process, the chemistry of the etching process, and/or sidewall polymerization during the etching process to adjust the lateral etch component.

The nanowire 11 and the section of the semiconductor layer 12 over the fin 16 are respectively divided into multiple nanowires 11 and multiple sections of semiconductor layers 12 of respective shorter lengths by the trenches 34. Similarly, the nanowire 13 and the section of the semiconductor layer 12 over the fin 18 are respectively divided into multiple nanowires 13 and multiple sections of the semiconductor layer 12 of shorter lengths by the trenches 34. The divided nanowires 11, 13 have a length dimension L1 that coincides in a vertical direction with the widest portion of the trenches 34. The narrowest portions of the trenches 34 are located in the fins 16, 18 and form channel regions 36 in the fins 16, 18. Each of channel regions 36 has a length dimension L2 that is greater than the length dimension L1 of the nanowires 11, 13. The trenches 34 taper between the nanowires 11 and the channel regions 36 in the fins 16 and between the nanowires 13 and the channel regions 36 in the fins 18 over the height of the sections of the semiconductor layer 12. The sections of the semiconductor layer 12 taper inversely from the length dimension L1 to the length dimension L2.

The tapered sections of the semiconductor layer 12 and the tapered intermediate sections 29 of the sacrificial gate structures 23, 24, 25 are aligned in a lateral direction. In an embodiment, the upper and lower surfaces of the tapered sections of the semiconductor layer 12 may be respectively coplanar with the upper and lower surfaces of the tapered intermediate sections 29 of the sacrificial gate structures 23, 24, 25. In an embodiment, the taper angle of the sections of the semiconductor layer 12 may be equal to the taper angle of the intermediate sections 29 of the sacrificial gate structures 23, 24, 25. The channel regions 26 in the fins 16, 18 and the lower sections 30 of the sacrificial gate structures 23, 24, 25 are aligned in a lateral direction. The upper sections 28 of the sacrificial gate structures 23, 24, 25 are arranged to overlap with the nanowires 11, 13 to the level of the top surfaces of the fins 16, 18.

Figure 7:
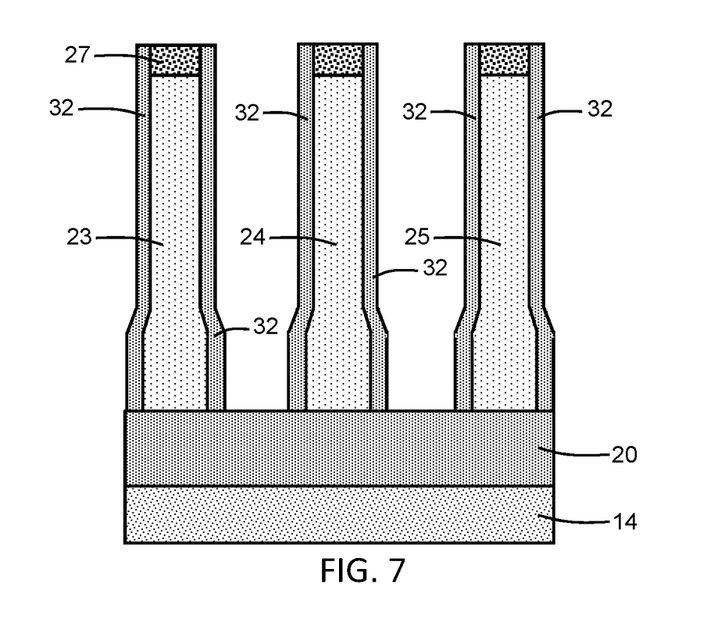
Figure 7A:
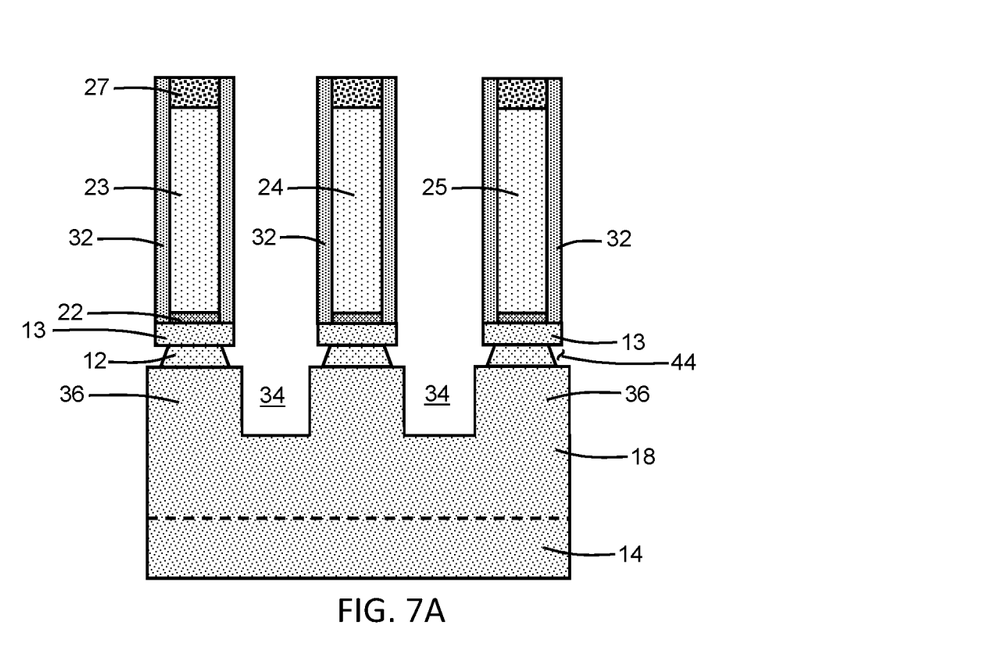

With reference to FIGS. 7, 7A in which like reference numerals refer to like features in FIGS. 6, 6A and at a subsequent fabrication stage of the processing method, the sections of the semiconductor layer 12 are laterally recessed relative to the nanowires 11, 13 and channel regions 36 of the fins 16, 18 with a dry or wet isotropic etching process that etches the semiconductor material constituting the semiconductor layer 12 selective to the semiconductor materials constituting the nanowires 11, 13 and the fins 16, 18. The lateral recessing of the sections of the semiconductor layer 12 generates indents 44 because of the etch selectivity of the isotropic etching process. The length dimension of the sections of the semiconductor layer 12 at the nanowires 11, 13 is less than the length dimension L1 of the nanowires 11, 13. In an embodiment, the recessed sections of the semiconductor layer 12 may taper in the vertical direction from a width dimension equal to the width dimension CD2 of the lower sections 30 of the sacrificial gate structures 23, 24, 25 at the top surface of the channel regions 36 to a width dimension equal to the width dimension CD1 of the upper sections 28 of the sacrificial gate structures 23, 24, 25 at the nanowires 11, 13.

Figure 8:
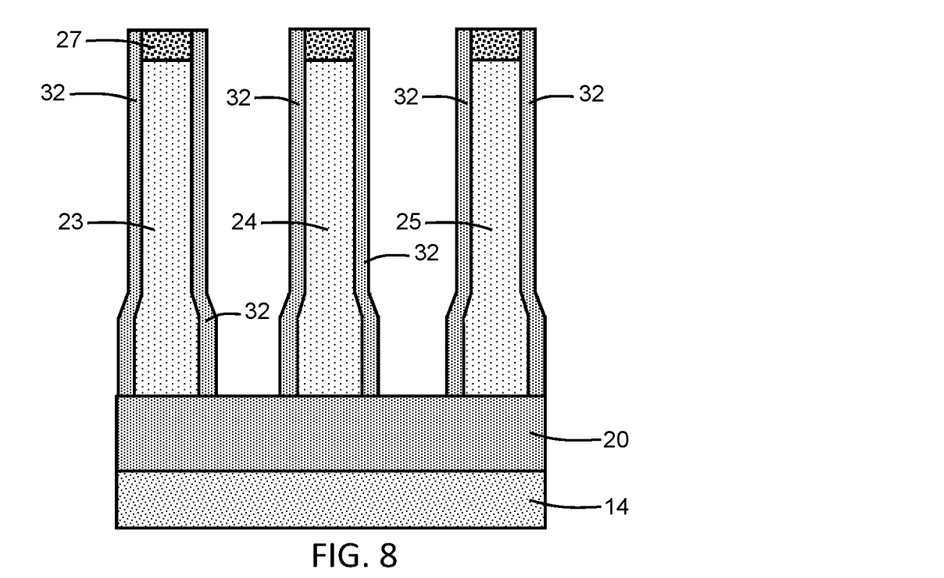
Figure 8A:
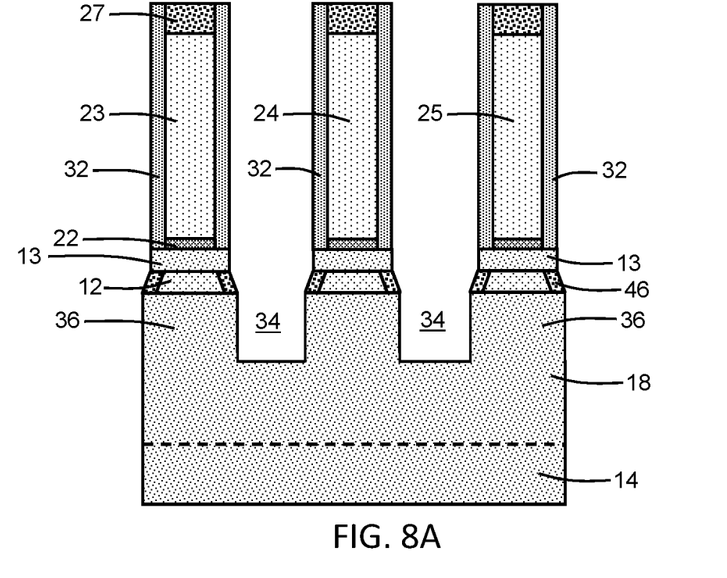

With reference to FIG. 8, 8A in which like reference numerals refer to like features in FIGS. 7, 7A and at a subsequent fabrication stage of the processing method, inner spacers 46 are subsequently formed in the indents 44 and are arranged adjacent to the recessed ends of the sections of the semiconductor layer 12. The inner spacers 46 may be formed by depositing a conformal layer (not shown) composed of a dielectric material, such as silicon nitride ($Si_3N_4$) deposited by atomic layer deposition (ALD), that fills the indents 44 by pinch-off. The conformal layer outside of the indents 44 is removed with an etching process, such as a wet chemical etching process using a heated solution containing phosphoric acid ($H_3PO_4$), which leaves the inner spacers 46 resident in the indents 44.

Figure 9:
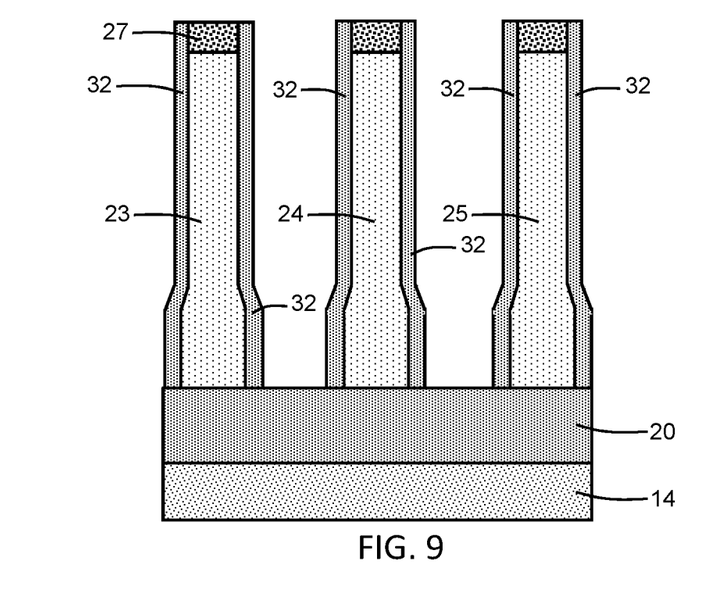
Figure 9A:
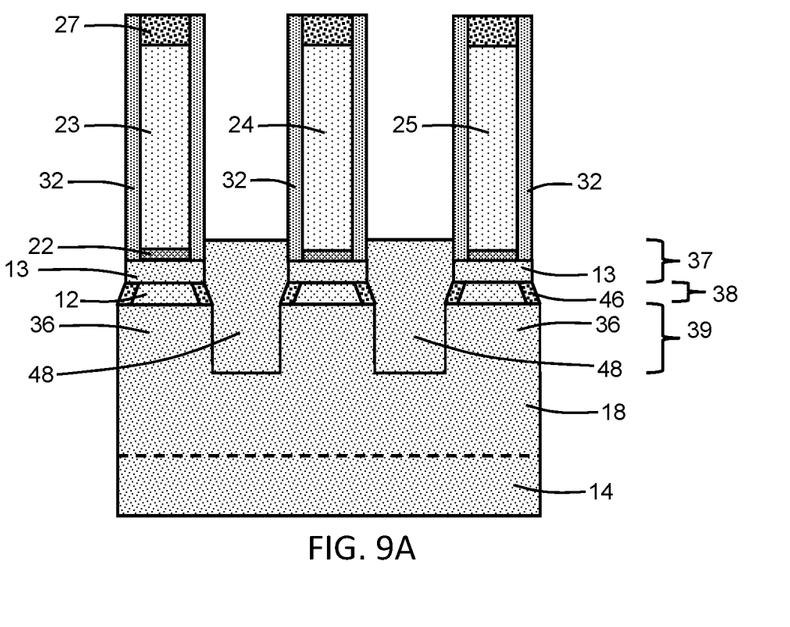

With reference to FIGS. 9, 9A in which like reference numerals refer to like features in FIGS. 8, 8A and at a subsequent fabrication stage of the processing method, source/drain regions 48 are formed by the epitaxial growth of an epitaxial semiconductor material. The semiconductor material of the source/drain regions grows from growth seeds provided by the nanowires 11, 13 and the channel regions 36 of the fins 16, 18 and grows from the substrate 14 at the bottom of the trenches 34. The different growth fronts merge during epitaxial growth in the spaces between adjacent channel regions 36 to form the source/drain regions 48. As used herein, the term "source/drain region" means a doped region of semiconductor material that can function as either a source or a drain of a field-effect transistor.

The semiconductor material of the epitaxial semiconductor layer may be heavily doped to have either p-type electrical conductivity or n-type electrical conductivity. In an embodiment, the epitaxial semiconductor layer may be doped during epitaxial growth with an n-type dopant from Group V of the Periodic Table (e.g., phosphorus (P) and/or arsenic (As)) that provides n-type electrical conductivity. In an alternative embodiment, the semiconductor material of the epitaxial semiconductor layer may be doped during epitaxial growth with a p-type dopant from Group III of the Periodic Table (e.g., boron (B), aluminum (Al), gallium (Ga), and/or indium (In)) that provides p-type electrical conductivity.

The semiconductor material forming the source/drain regions 48 is physically constrained during epitaxial growth to reproduce the shape of the trenches 34. Each source/drain region 48 includes an upper portion 37 that is arranged above the sections of the semiconductor layer 12, a lower portion 39 that is arranged below the sections of the semiconductor layer 12 and that is narrower than the upper portion, and an intermediate portion 38 that is tapered to provide a transition between the wider upper portion and the narrower lower portion. The intermediate portions 38 are aligned in a lateral direction with the sections of the semiconductor layer 12. The shape of the sacrificial gate structures 23, 24, 25 inversely mirrors the shape of the trenches 34 and source/drain regions 48. The wider upper portion 37 of each source/drain region 48 is arranged above the tapered intermediate portion 38 of each source/drain region 48, and the wider lower section 30 of the sacrificial gate structures 23, 24, 25 is arranged below the narrower upper section 28. The tapered intermediate portion 38 of each source/drain region 48 is aligned in a lateral direction with the intermediate sections 29 of the sacrificial gate structures 23, 24, 25.

Figure 10:
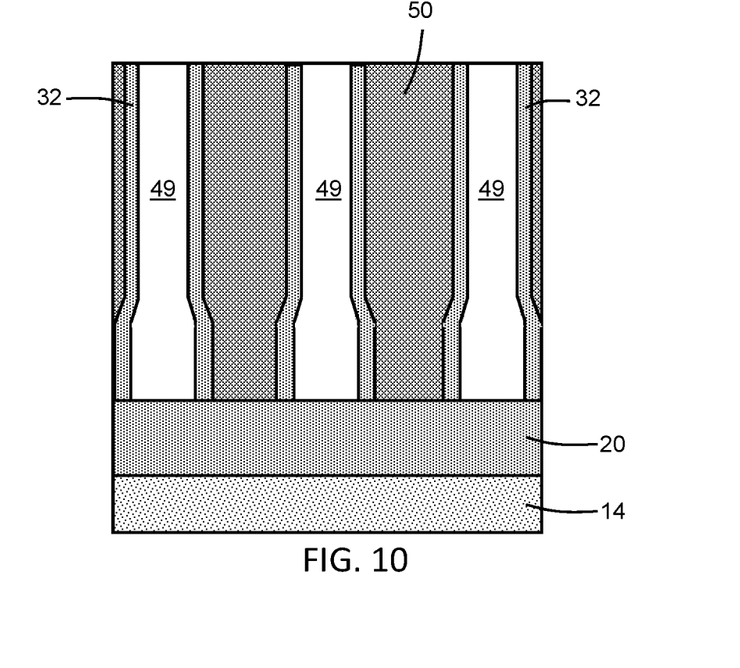
Figure 10A:
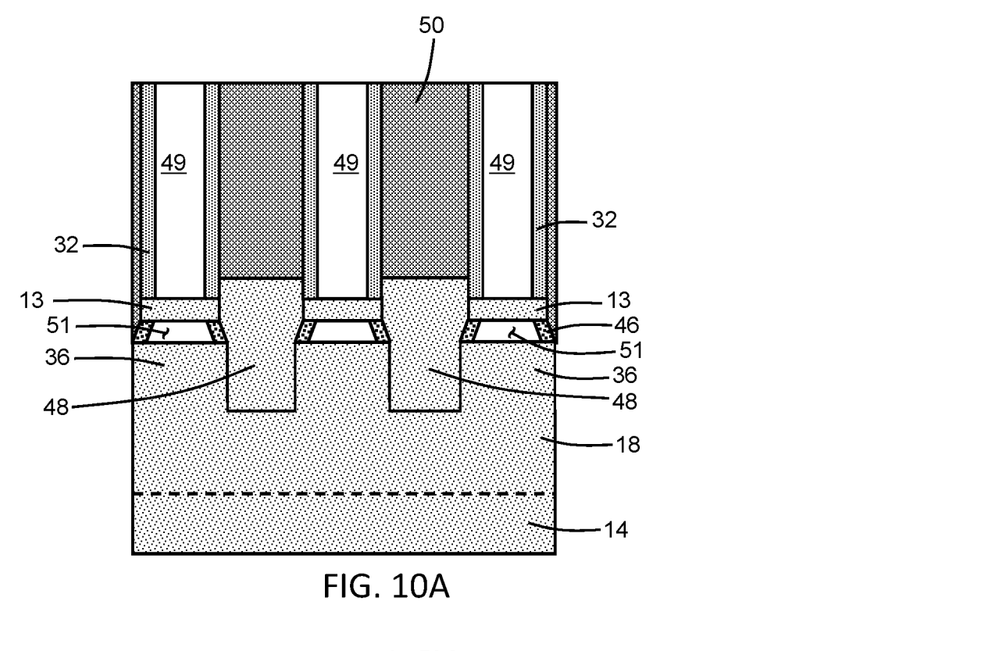

With reference to FIGS. 10, 10A in which like reference numerals refer to like features in FIGS. 9, 9A and at a subsequent fabrication stage of the processing method, an interlayer dielectric layer 50 is deposited and planarized by chemical mechanical polishing (CMP). The interlayer dielectric layer 50 may be composed of a dielectric material, such as silicon dioxide ($SiO_2$). The planarization of the interlayer dielectric layer 50 may remove the hardmask caps 27 from the sacrificial gate structures 23, 24, 25 and thereby reveal the sacrificial gate structures 23, 24, 25.

After forming the interlayer dielectric layer 50, the sacrificial gate structures 23, 24, 25 are removed with an etching process to form spaces 49, and the thin dielectric layer 22 is stripped from the nanowires 11, 13, the fins 16, 18, and the sections of the semiconductor layer 12 with an etching process. The removal of the sacrificial gate structures 23, 24, 25 and the thin dielectric layer 22 exposes the sections of the semiconductor layer 12, which are then removed with the same or a different etching process to form spaces 51. The nanowires 11, 13, which are respectively arranged over the channel regions 36 of the fins 16, 18, are released by the etching process(es).

The dimensions of the spaces 49 may be equal to the dimensions of the sacrificial gate structures 23, 24, 25, and the dimensions of the spaces 51 may be equal to the dimensions of the sections of the tapered sections of the semiconductor layer 12. The spaces 49 merge with the spaces 51 around the sides of the nanowires 11, 13 such that each of the merged spaces 49, 51 extend about the circumference of one of the nanowires 11, 13. Over the shallow trench isolation regions 20, the spaces 49 have stacked dual-width sections that extend to the shallow trench isolation regions 20. Specifically, each space 49 has a wider lower section that is arranged in a vertical direction between a narrower upper section and the shallow trench isolation regions 20.

Over the nanowires 11, 13 and fins 16, 18, the narrower upper section of each space 49 extends to the upper surface of the nanowires 11, 13 and along the side edges of the nanowires 11, 13. Spaces 51 are arranged in a vertical direction between the nanowires 11 and the channel regions 36 of the fin 16 and between the nanowires 13 and the channel regions of the fin 18. The spaces 51 may have a height in a vertical direction equal to the thickness of the removed sections of the semiconductor layer 12. The inner spacers 46 bound the spaces 51 in a lateral direction. The recessing of the sections of the semiconductor layer 12 forming the indents 44 may be used to select the lateral dimensions of the spaces 51.

Figure 11:
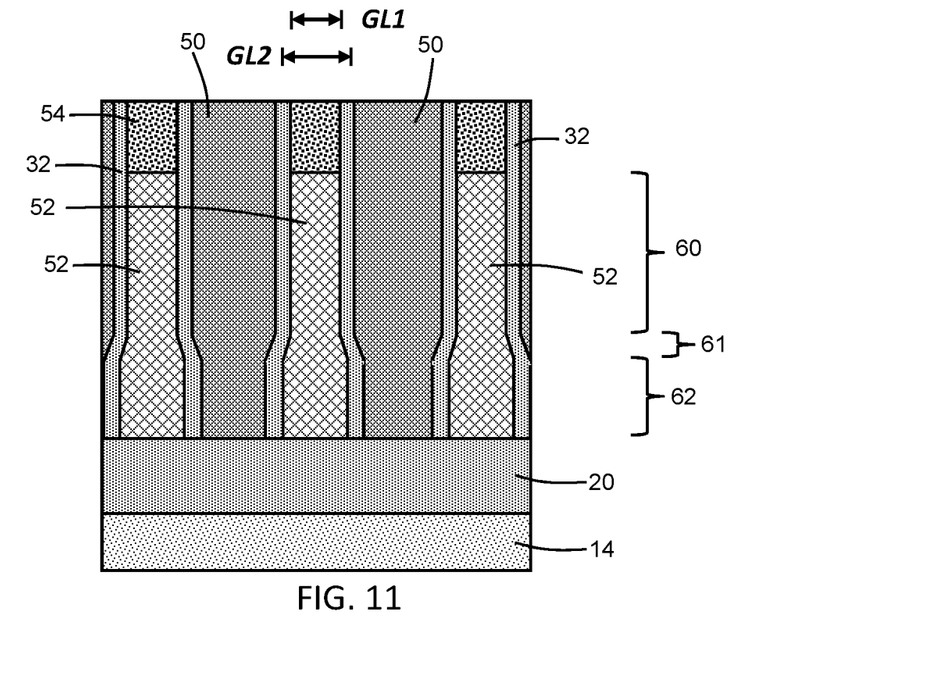
Figure 11A:
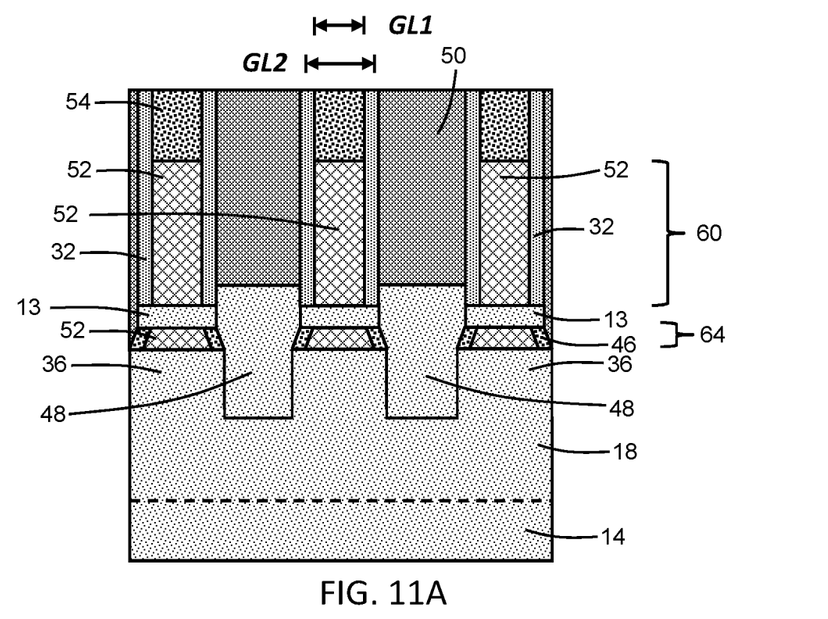

With reference to FIGS. 11, 11A in which like reference numerals refer to like features in FIGS. 10, 10A and at a subsequent fabrication stage of the processing method, gate structures 52 are formed in the spaces 49, 41 as part of a replacement metal gate process to fabricate a multiple-gate field-effect transistor. Each of the gate structures 52 may be formed from a gate stack that includes an interface layer, a gate dielectric layer, and a metal gate electrode. The interface layer coats the exterior surfaces of the nanowires 11, 13 and the fins 16, 18, and the gate dielectric layer is arranged in the gate stack between the metal gate electrode and the interface layer. Self-aligned contact (SAC) caps 54 composed of a dielectric material, such as silicon nitride ($Si_3N_4$), are formed in the spaces between the sidewall spacers 32 over each of the gate structures 52.

The interface layer of the gate structures 52 may be composed of a dielectric material, such as an oxide of silicon (e.g., silicon dioxide ($SiO_2$)). The gate dielectric layer of the gate structures 52 may be composed of a dielectric material, such as a high-k dielectric material like hafnium oxide ($HfO_2$). The metal gate electrode of the gate structures 52 includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). The metal gate electrode of the gate structures 52 may include different combinations of the conformal barrier metal layers and/or work function metal layers. For example, the metal gate electrode may include conformal work function metal layers characteristic of a p-type field-effect transistor. As another example, the metal gate electrode may include conformal work function metal layers characteristic of an n-type field-effect transistor.

The gate structures 52 have multiple widths dimensions arranged along their respective heights that reflect the multiple width dimensions of the removed and replaced sacrificial gate structures 23, 24, 25 and the removed and replaced sections of the semiconductor layer 12. Over the shallow trench isolation regions 20 and adjacent to the respective sidewalls of the fins 16, 18, each of the gate structures 52 includes an upper section 60 with a length dimension GL1, a lower section 62 with length dimension GL2 that is greater than length dimension GL1, and a tapered intermediate section 61 arranged in a vertical direction between the lower section 62 and the upper section 60. The lower sections 62 are arranged adjacent to the side edges of the channel regions 36 of the fins 16, 18 such that the channel regions 36 have a gate length equal to the length dimension GL2. The gate length GL2 may be equal to the width dimension CD2 of the section 30 of the sacrificial gate structures 23, 24, 25. The gate length GL2 represents the effective length of the distance in the channel regions 36 of the fins 16, 18 between the nearest edges of the source/drain regions 48.

Over the nanowires 11, 13 and fins 16, 18, each of the gate structures 52 includes the upper section 60 with a length dimension GL1 over the nanowires 11, 13 and a tapered lower section 64. The tapered lower sections 64, which are formed in the spaces 51, are arranged in the vertical direction between the channel regions 36 of the fins 16, 18 and the nanowires 11, 13. Each of the tapered lower sections 64 may have the length dimension GL1 at the nanowires 11, 13 and the length dimension GL2 at the top surface of the channel regions 36 that is greater than the length dimension GL1. The nanowires 11, 13 may have a gate length on all sides equal to the length dimension GL1. The gate length GL1 represents the effective length of the distance in the nanowires 11, 13 between the nearest edges of the source/drain regions 48. At their respective top surfaces, the channel regions 36 may have a gate length equal to the length dimension GL2, which is consistent with the gate length at their side edges.

In an alternative embodiment, the recessing of the sections of the semiconductor layer 12 forming the indents 44 may be used to select the lateral dimensions of the spaces 51 such that the gate lengths at the tapered section 64 differ from the length dimensions GL1 and GL2.

The nanowires 11, 13 and the fins 16, 18 collectively form a hybrid field-effect transistor that includes a fin-type field-effect transistor (FinFET) and a nanowire field-effect transistor over the FinFET. The nanowires 11, 13 and the fins 16, 18 are connected with the same source/drain regions 48.

Each of the gate structures 52 includes a section that is wrapped about the nanowires 11, 13 in a gate-all-around (GAA) design. As described above, the nanowires 11, 13, where surrounded by the gate structures 52, may have a gate length GL1 that is less than the gate length GL2 for the channel regions 36 of the fins 16, 18 where surrounded on multiple sides by the gate structures 52. The different gate lengths of the nanowires 11, 13 and the channel regions 36 of the fins 16, 18 are produced by the modulated etching processes forming the dual-width trenches 34 and the dual-width sacrificial gate structures 23, 24, 25 and the removal of the sections of the semiconductor layer 12.

Figure 12:
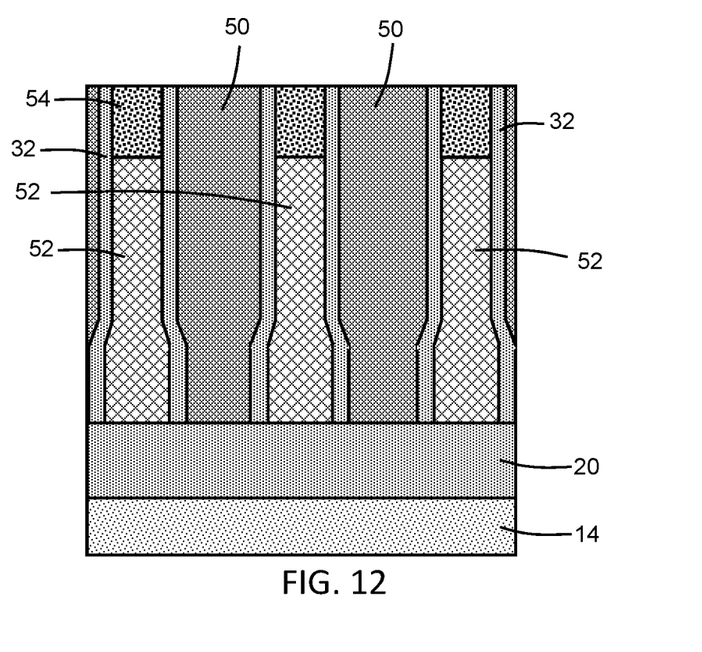
Figure 12A:
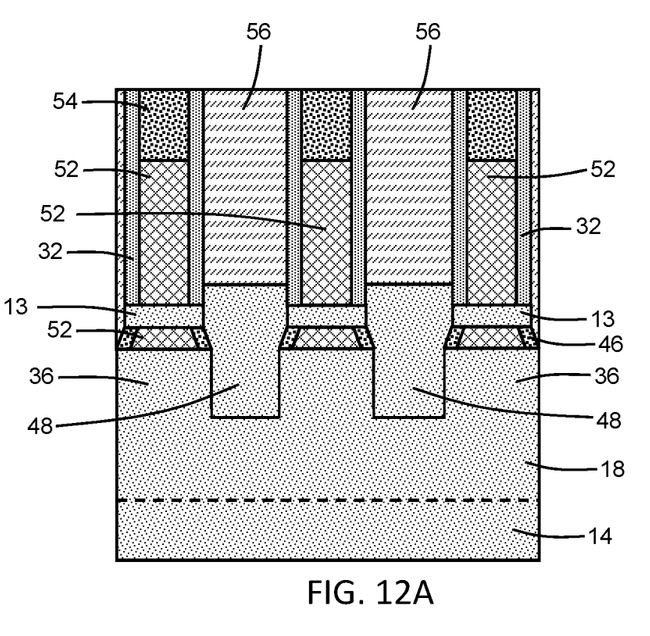

With reference to FIGS. 12, 12A in which like reference numerals refer to like features in FIGS. 11, 11A and at a subsequent fabrication stage of the processing method, trench silicide (TS) contacts 56 are formed that extend vertically to the source/drain regions 48. The TS contacts 56 may include a metal silicide, such as titanium silicide ($TiSi_2$), tungsten silicide ($WSi_2$), nickel silicide (NiSi), or cobalt silicide ($CoSi_2$) deposited by chemical vapor deposition (CVD), as well as an overlying conductor, such as tungsten (W) or cobalt (Co) that may also be deposited by chemical vapor deposition (CVD). The TS contacts 56 may be planarized by chemical mechanical polishing (CMP) to the level of the caps 54.

The increased width of the upper portion 37 of the source/drain regions 48 may permit the size of the TS contacts 56 to be increased without incurring a loss of effective width (Weff) that is correlated with the transistor on-current. The contact resistance between the source/drain regions 48 and TS contacts 56 may be improved because the effective surface area of the source/drain regions 48 available for contact by the TS contacts 56 is increased in comparison with conventional source/drain regions in a stacked nanowire/fin field-effect transistor lacking the multiple widths.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
    a semiconductor substrate;
    a semiconductor fin projecting in a vertical direction relative to the semiconductor substrate, the semiconductor fin having a channel region;
    a nanowire arranged over the channel region of the semiconductor fin;
    a source/drain region connected with the nanowire and the channel region of the semiconductor fin; and
    a gate structure that overlaps with the semiconductor fin and the nanowire, the gate structure including a section arranged between the nanowire and the channel region of the semiconductor fin, and the section of the gate structure tapers in the vertical direction,
    wherein the nanowire has a first gate length, and the channel region of the semiconductor fin has a second gate length that is greater than the first gate length.

2. The structure of claim 1 wherein the source/drain region includes a first portion directly connected with the channel region of the semiconductor fin and a second portion directly connected with the nanowire, and the second portion of the source/drain region is wider than the first portion of the source/drain region.

3. The structure of claim 2 wherein the second portion of the source/drain region is arranged above the semiconductor fin, and further comprising:
    a contact connected with the second portion of the source/drain region.

4. The structure of claim 1 wherein the gate structure surrounds the nanowire in a gate-all-around arrangement, the section of the gate structure is positioned in the vertical direction between the nanowire and the channel region of the semiconductor fin, and the section of the gate structure has a height and a variable length dimension that tapers in the vertical direction.

5. The structure of claim 4 wherein the section of the gate structure tapers from a first length dimension at the nanowire to a second length dimension at the channel region of the semiconductor fin, and the second length dimension is greater than the first length dimension.

6. The structure of claim 5 wherein the first length dimension is equal to the first gate length, and the second length dimension is equal to the second gate length.

7. The structure of claim 4 further comprising:
    an inner dielectric spacer laterally arranged in a lateral direction between the section of the gate structure and the source/drain region.

8. The structure of claim 7 wherein the section of the gate structure is recessed in the lateral direction relative to the nanowire.

9. The structure of claim 4 wherein the source/drain region includes a first portion connected with the channel region of the semiconductor fin and a second portion connected with the nanowire, the first portion of the source/drain region is wider than the second portion of the source/drain region, and the section of the gate structure is arranged between the first portion of the source/drain region and the second portion of the source/drain region.

10. The structure of claim 1 wherein the source/drain region includes a section that is arranged between the nanowire and the channel region of the semiconductor fin, and the section of the source/drain region is tapered in the vertical direction.

11. The structure of claim 10 wherein the section of the source/drain region and the section of the gate structure are inversely tapered in the vertical direction.

12. A method of forming a field-effect transistor, the method comprising:
   forming a semiconductor fin and a nanowire arranged over a channel region of the semiconductor fin;
   forming a source/drain region that is connected with the nanowire and the channel region of the semiconductor fin; and
   forming a gate structure that overlaps with the channel region of the semiconductor fin and the nanowire,
   wherein the semiconductor fin projects in a vertical direction relative to a semiconductor substrate, the gate structure includes a section arranged between the nanowire and the channel region of the semiconductor fin, the section of the gate structure tapers in the vertical direction, the nanowire has a first gate length, and the channel region of the semiconductor fin has a second gate length that is greater than the first gate length.

13. The method of claim 12 wherein forming the semiconductor fin and the nanowire arranged over the channel region of the semiconductor fin comprises:
   epitaxially growing a first semiconductor layer and a second semiconductor layer on a substrate; and
   patterning the first semiconductor layer to form the nanowire, the second semiconductor layer to form a sacrificial layer, and the substrate to form the semiconductor fin.

14. The method of claim 13 wherein forming the semiconductor fin and the nanowire arranged over the channel region of the semiconductor fin further comprises:
   etching, with an etching process, a trench extending through the nanowire and the sacrificial layer and penetrating into the semiconductor fin to define the channel region of the semiconductor fin,
   wherein the etching process has a modulated lateral etching component such that the trench is wider adjacent to the nanowire and narrower adjacent to the channel region of the semiconductor fin.

15. The method of claim 14 wherein forming source/drain region connected with the semiconductor fin and the nanowire comprises:
   recessing the sacrificial layer to form an indent arranged in the vertical direction between the nanowire and the semiconductor fin;
   forming an inner dielectric spacer in the indent; and
   after forming the inner dielectric spacer, epitaxially growing a semiconductor material in the trench to form the source/drain region.

16. The method of claim 15 wherein the source/drain region includes a first section adjacent to the nanowire and a second section adjacent to the channel region of the semiconductor fin, the first section is wider than the second section, and further comprising:
   forming a contact extending vertically to the first section of the source/drain region.

17. The method of claim 12 wherein a sacrificial layer is arranged between the nanowire and the semiconductor fin, and forming the gate structure that overlaps with the channel region of the semiconductor fin and the nanowire comprises:
   etching a blanket layer with an etching process having a modulated lateral etching component to form a sacrificial gate structure that has a first width above the sacrificial layer and a second width below the sacrificial layer.

18. The method of claim 17 wherein forming the gate structure that overlaps with the channel region of the semiconductor fin and the nanowire further comprises:
   forming one or more sidewall spacers on the sacrificial gate structure; and
   after forming the one or more sidewall spacers, replacing the sacrificial gate structure with the gate structure,
   wherein the first gate length of the gate structure corresponds to the first width of the sacrificial gate structure and the second gate length of the gate structure corresponds to the second width of the sacrificial gate structure.

19. The method of claim 18 wherein replacing the sacrificial gate structure with the gate structure comprises:
   removing the sacrificial layer to release the nanowire.

* * * * *